(12) United States Patent
Su et al.

(10) Patent No.: US 7,126,559 B2
(45) Date of Patent: Oct. 24, 2006

(54) USB FLASH-MEMORY DRIVE WITH DAZZLING MARQUEE-PATTERN DRIVER FOR MULTI-LED DISPLAY

(75) Inventors: Ching-Jong Su, San Jose, CA (US); Sun-Teck See, San Jose, CA (US); Tzu-Yih Chu, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 474 days.

(21) Appl. No.: 10/707,622

(22) Filed: Dec. 24, 2003

(65) Prior Publication Data

US 2005/0146491 A1 Jul. 7, 2005

(51) Int. Cl.
*G09G 3/14* (2006.01)

(52) U.S. Cl. ........................................ 345/46; 345/905

(58) Field of Classification Search ............ 345/33–36, 345/39, 44–46, 76, 77, 82, 83, 905; 365/52; 360/97.01; 361/707; 711/103, 115
See application file for complete search history.

(56) References Cited

U.S. PATENT DOCUMENTS

| | | | | |
|---|---|---|---|---|
| 4,999,767 | A | 3/1991 | Durkin | 714/57 |
| 5,323,798 | A | 6/1994 | Yang | 135/16 |
| 6,122,175 | A | 9/2000 | Shieh | 361/737 |
| 6,157,559 | A * | 12/2000 | Yoo | 365/52 |
| 6,159,037 | A | 12/2000 | Madsen et al. | 439/488 |
| 6,185,718 | B1 | 2/2001 | Dell et al. | 714/800 |
| 6,239,776 | B1 | 5/2001 | Havel | 345/83 |
| 6,295,031 | B1 | 9/2001 | Wallace et al. | 343/702 |
| 6,317,503 | B1 | 11/2001 | Mercs et al. | 381/119 |
| 6,414,662 | B1 * | 7/2002 | Havel | 345/83 |
| 6,424,096 | B1 | 7/2002 | Lowe et al. | 315/185 R |
| 6,438,638 | B1 | 8/2002 | Jones et al. | 710/301 |
| 6,490,163 | B1 | 12/2002 | Pua et al. | 361/737 |
| 6,894,864 | B1 * | 5/2005 | Chang et al. | 360/97.01 |
| 6,894,865 | B1 * | 5/2005 | Chang et al. | 360/97.01 |
| 6,894,901 | B1 * | 5/2005 | Simon | 361/707 |
| 2003/0035054 | A1 | 2/2003 | Ohmura | 348/231.2 |
| 2003/0088805 | A1 | 5/2003 | Majni et al. | 714/6 |
| 2003/0100203 | A1 | 5/2003 | Yen | 439/79 |
| 2003/0145141 | A1 | 7/2003 | Chen et al. | 710/74 |

* cited by examiner

*Primary Examiner*—Richard Hjerpe
*Assistant Examiner*—Kevin M. Nguyen
(74) *Attorney, Agent, or Firm*—Stuart T. Auvinen; g Patent LLC

(57) ABSTRACT

A multi-light-emitting diode (LED) display for a USB flash drive produces a visually dazzling display. When accessed, a USB flash controller drives pulses onto an activity signal that increments a counter on a pattern-decoding generator. The pattern-decoding generator decodes the count and drives signals to data outputs. The data outputs connect to LED's, turning LED's on and off according to a display pattern. The pattern can be programmed by the USB flash controller into the pattern-decoding generator, or can be a hardwired pattern. Marquee patterns having a lit LED appearing to move down a line of LED's have more visual appeal than single LED indicators. Each data line can drive two LED's in different parts of a dual display, reducing costs. Multi-color LED's can be used to improve variety. The multiple LED's and the pattern-decoding generator can be mounted on a flexible PCB.

6 Claims, 9 Drawing Sheets

| GPB (7:0) | Function | Figure |
|---|---|---|
| 0000 0000 | Line Continue (Forward) | FIG. 9A |
| 0000 0001 | Line Continue (Backward) | FIG. 9B |
| 0000 0010 | Line Jump 1 (Forward) | FIG. 9C |
| 0000 0011 | Line Jump 1 (Backward) | FIG. 9D |
| 0000 0100 | Line Jump 2 (Forward) | FIG. 9E |
| 0000 0101 | Line Jump 2 (Backward) | FIG. 9F |
| 0000 0110 | Line Jump 3 (Forward) | |
| 0000 0111 | Line Jump 3 (Backward) | |
| 0000 1000 | Line Jump 4 (Forward) | |
| 0000 1001 | Line Jump 4 (Backward) | |
| 0000 1010 | Line Jump 5 (Forward) | |
| 0000 1011 | Line Jump 5 (Backward) | |
| 0000 1100 – 0000 1111 | Reserved for Future | |
| 0001 0000 | Line 2 Continue (Forward) | FIG. 10A |
| 0001 0001 | Line 2 Continue (Backward) | FIG. 10B |
| 0001 0010 | Line Inward | FIG. 10C |
| 0001 0011 | Line Outward | FIG. 10D |
| 0001 0100 | Line 2 Jump 1 (Forward) | FIG. 10E |
| 0001 0101 | Line 2 Jump 1 (Backward) | FIG. 10F |
| 0001 0110 – 0001 1111 | Reserved for Future | |
| 0010 0000 | 2 Clockwise Circles | FIG. 11A |
| 0010 0001 | 2 Counter Clockwise Circles | FIG. 11B |
| 0010 0010 | 2 Line Inward | FIG. 11C |
| 0010 0011 | 2 Line Outward | FIG. 11D |
| 0010 0100 – 0010 1111 | Reserved for Future | |
| 0011 0000 – 0011 1111 | Reserved for Round Circles Sequencings | |
| 0100 0000 – 0100 1111 | Reserved for Tri-angles Sequencings | |
| 0101 0000 – 0101 1111 | Reserved for Square Sequencing | |
| 0110 0000 – 1111 1111 | Reserved | |

FIG. 6

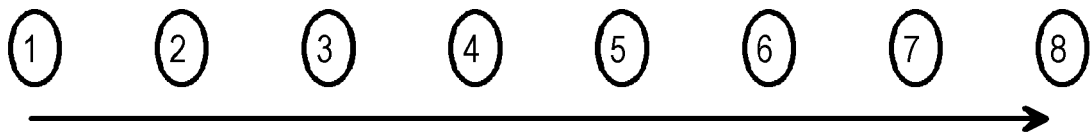
FIG. 9A  CONTINUE FORWARD
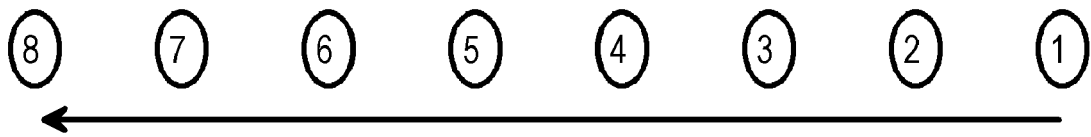
FIG. 9B  CONTINUE BACKWARD
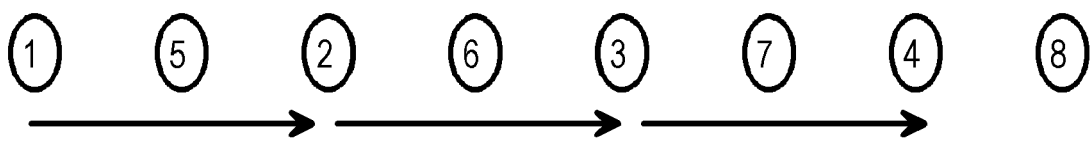
FIG. 9C  JUMP-1 FORWARD
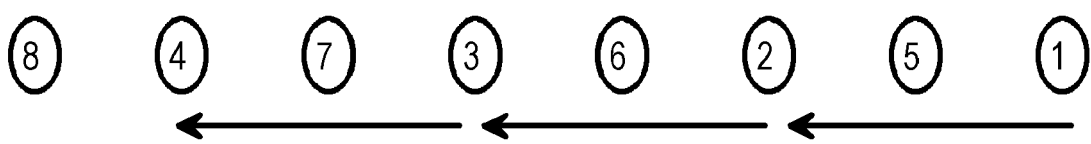
FIG. 9D  JUMP-1 BACKWARD
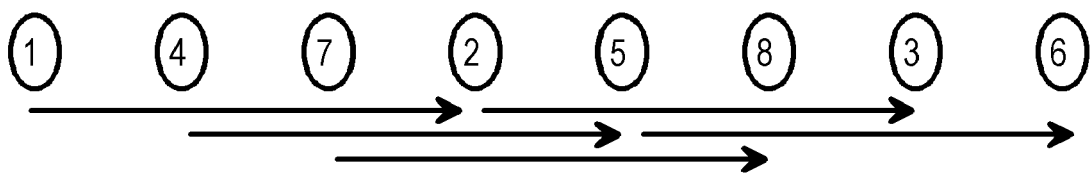
FIG. 9E  JUMP-2 FORWARD
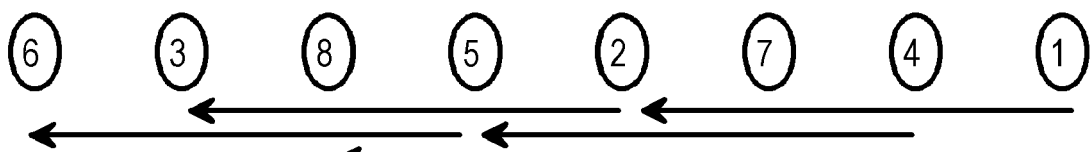
FIG. 9F  JUMP-2 BACKWARD

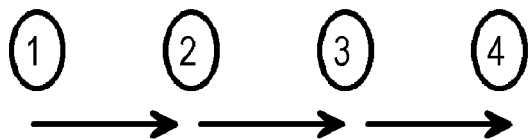
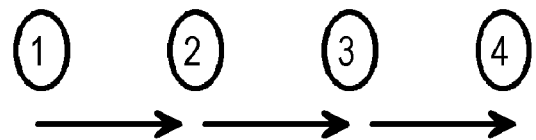
FIG. 10A  2X CONTINUE FORWARD
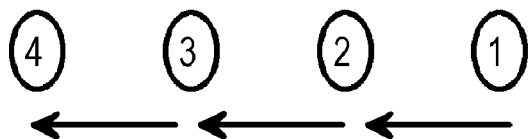
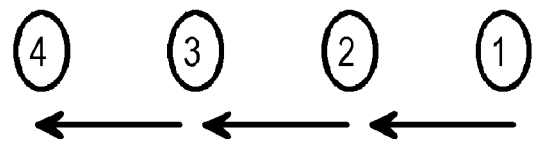
FIG. 10B  2X CONTINUE BACKWARD
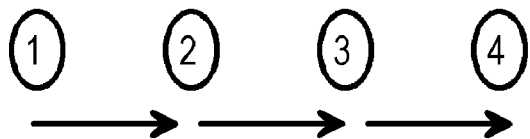
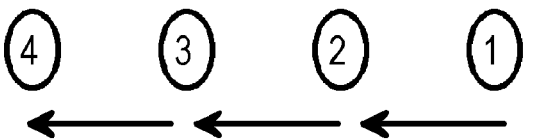
FIG. 10C  INWARD
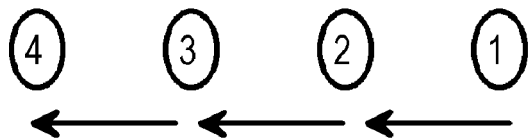
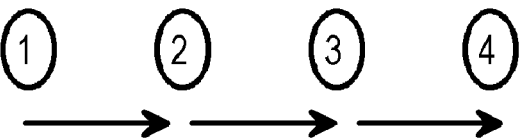
FIG. 10D  OUTWARD
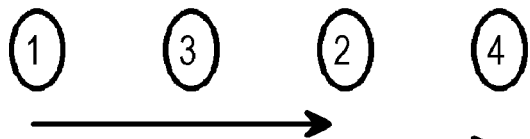
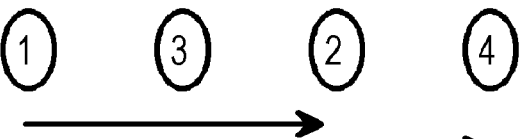
FIG. 10E  2X JUMP-1 FORWARD
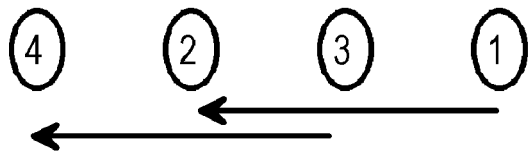
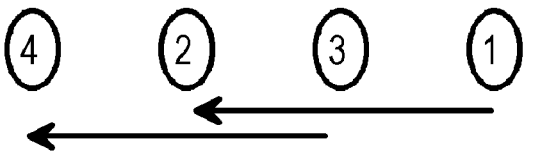
FIG. 10F  2X JUMP-1 BACKWARD

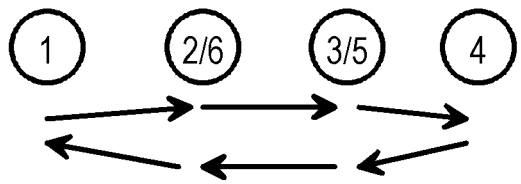
FIG. 11A
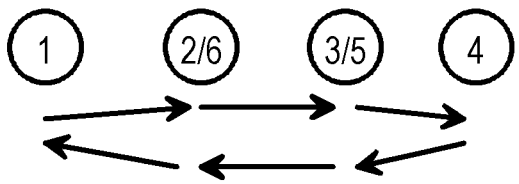
2X CLOCKWISE CIRCLES
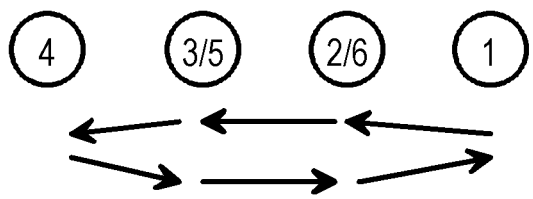
FIG. 11B
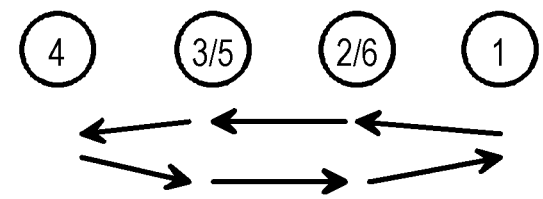
2X COUNTER-CLOCKWISE CIRCLES
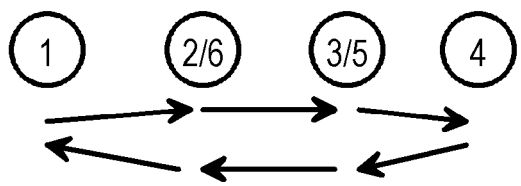
FIG. 11C
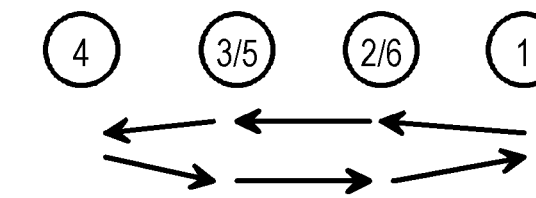
2X INWARD CIRCLES
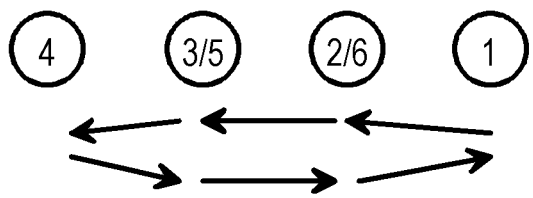
FIG. 11D
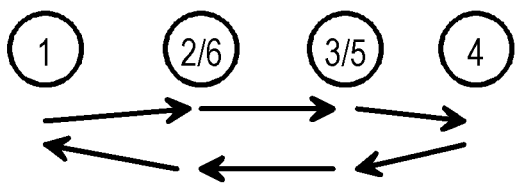
2X OUTWARD CIRCLES

USB FLASH-MEMORY DRIVE WITH DAZZLING MARQUEE-PATTERN DRIVER FOR MULTI-LED DISPLAY

BACKGROUND OF INVENTION

This invention relates to indicator displays, and more particularly to a light-emitting diode display for a Universal-Serial-Bus (USB) flash-memory device.

Electronic storage drives often have indicator lamps. For example, a hard-disk drive on a personal computer (PC) may have a single light-emitting diode (LED) that is illuminated while the disk is being accessed. An external flash-memory peripheral drive may have an LED that is illuminated while being written. The user can safely remove the flash-memory drive or its media once the light goes out, indicating that the writing operation is completed.

Flash memory has gained wide acceptance for its non-volatile storage, which is ideal for portable devices that may lose power, since the data is not lost when stored in the flash memory. Flash memories are constructed from electrically-erasable programmable read-only memory (EEPROM) cells.

Universal-Serial-Bus (USB) has become a popular standard interface for connecting peripherals to a host such as a personal computer (PC). USB-based flash-memory storage devices or "drives" have been developed to transport data from one host to another, replacing floppy disks. While large external flash drives may be used, smaller USB flash drives known as key-chain or key drives have been a rapidly growing market.

A USB flash-memory device can be constructed from a microcontroller, a flash-memory controller or interface, and one or more flash-memory chips. A serial interface on the microcontroller connects to the USB bus to the host, and data from the serial interface is transferred through the microcontroller to the flash controller and is written to the flash-memory chips.

The microcontroller can drive an output port that connects externally to a LED. The microcontroller can then turn the LED on or off by writing a zero or a one to the output port. The microcontroller can set the output port to a one when activity is occurring on the drive, such as any access of the flash memory, such as read, write and erase.

While such an LED activity light is useful, the LED is often small and barely noticeable to the user. A more elaborate display is desired to better capture the user's attention. A display for a USB flash drive is desired that has multiple LED's. A more dazzling display on a USB flash drive is desirable that can noticeably tell the user when data is being transferred to and from the flash drive. A display that could also be a selling point for the USB flash drive is desired, since the dazzling display could be made to flash on the display model in a store.

BRIEF DESCRIPTION OF DRAWINGS

FIG. 6 is a table of commands or an address map sent over the general-purpose bus to select LED cycling patterns.

FIGS. 9A–F show linear-display pattern sequences.

FIGS. 10A–F show dual linear-display pattern sequences.

FIGS. 11A–D show dual circular pattern sequences.

DETAILED DESCRIPTION

The present invention relates to an improvement in USB flash drive indicator displays. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
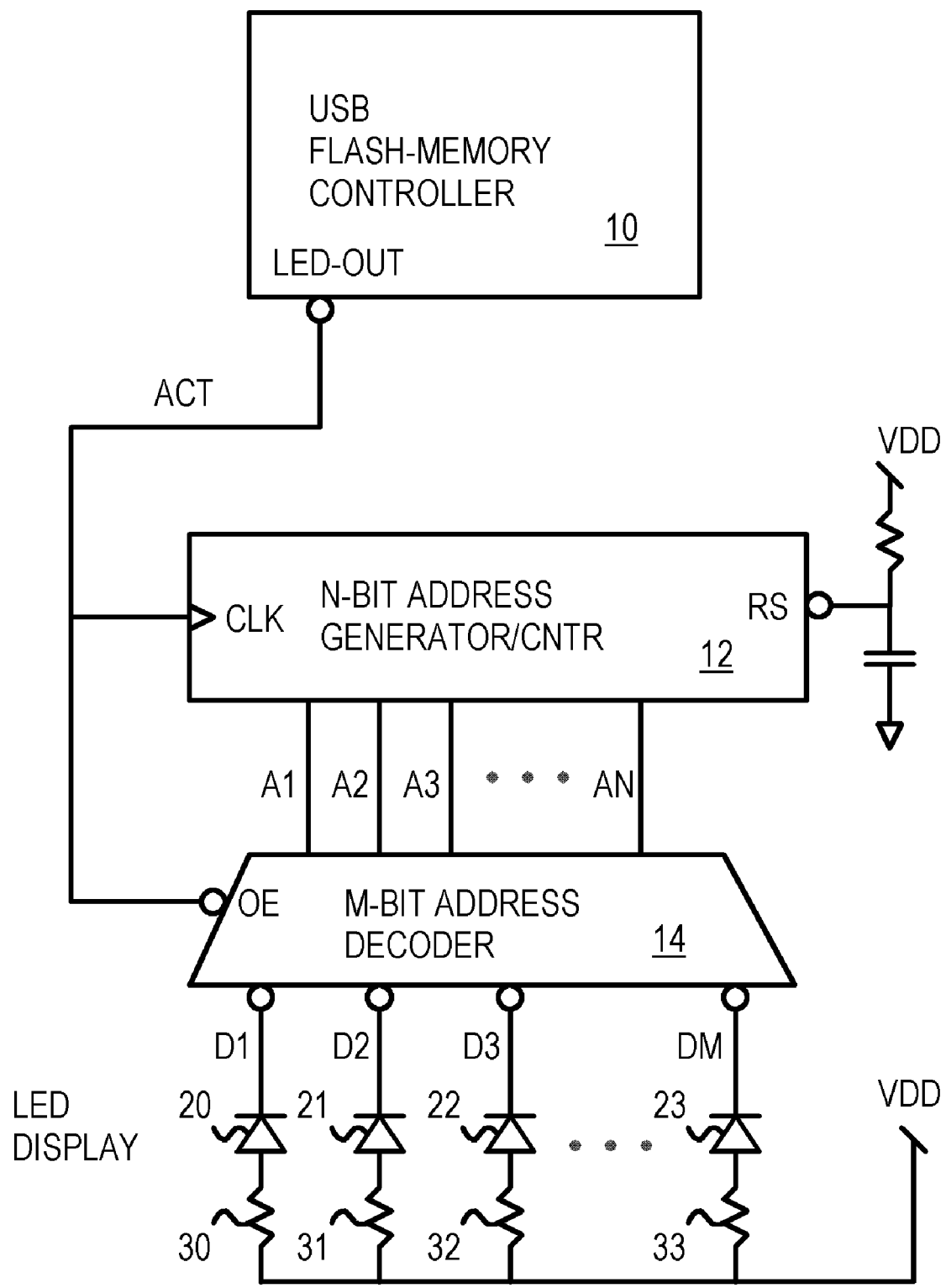
FIG. 1 is a block diagram of a multi-LED display on a USB flash-memory drive.

FIG. 1 is a block diagram of a multi-LED display on a USB flash-memory drive. The USB flash drive can be a small portable device about the size of a thick key or pack of chewing gum. A USB connector (not shown) plugs into a USB port on a host, allowing USB signals to be received by USB flash controller 10. USB flash controller 10 controls one or more flash-memory chips (not shown) on the USB flash drive.

USB flash controller 10 contains a microcontroller that generates an activity signal on an output port that drives external pin LED-OUT on the package containing USB flash controller 10. Pin LED-OUT drives activity line ACT, which can be a wiring trace on a printed-circuit board (PCB) containing USB flash controller 10, address generator 12, and address decoder 14.

Activity signal ACT is applied as the clock to address generator 12, which can be an N-bit counter. Each pulse of activity signal ACT increases the count of address generator 12, which is reflected in address outputs A1:AN. The count of address generator 12 is reset to zero (or some other value) by its reset RS input, which is initially pulled low at power-on by a capacitor, but is later pulled high by a pull-up resistor to end the active-low reset pulse.

The N address lines from address generator 12 are input to address decoder 14. M-bit address decoder 14 decodes the N address inputs to generate M data outputs D1, D2, D3, . . . DM. N is independent of M. N could be smaller or bigger or equal to M. The value $2^N$ represents a total number of addresses and M represents the number of outputs for each address. The output LED lines could have only one data output active at a time, or more than one data output can be active at a time. The activity signal ACT can also drive an output-enable OE input to address decoder 14 in some embodiments, so that the LED's are driven only during the low pulse of activity signal ACT.

LED's 20, 21, 22, . . . 23 are driven by data outputs D1, D2, . . . DM from address decoder 14. Limiting resistors 30, 31, 32, . . . 33 couple LED's 20, 21, 22, . . . 23 to power (VDD) and limit current through a LED when a data output is driven low.

When a data output is driven low by address decoder 14, current is pulled through the LED, causing the LED to be illuminated. For example, when D2 is driven low by address decoder 14, LED 21 is turned on as current is drawn through limiting resistor 31 from VDD.

Figure 2:
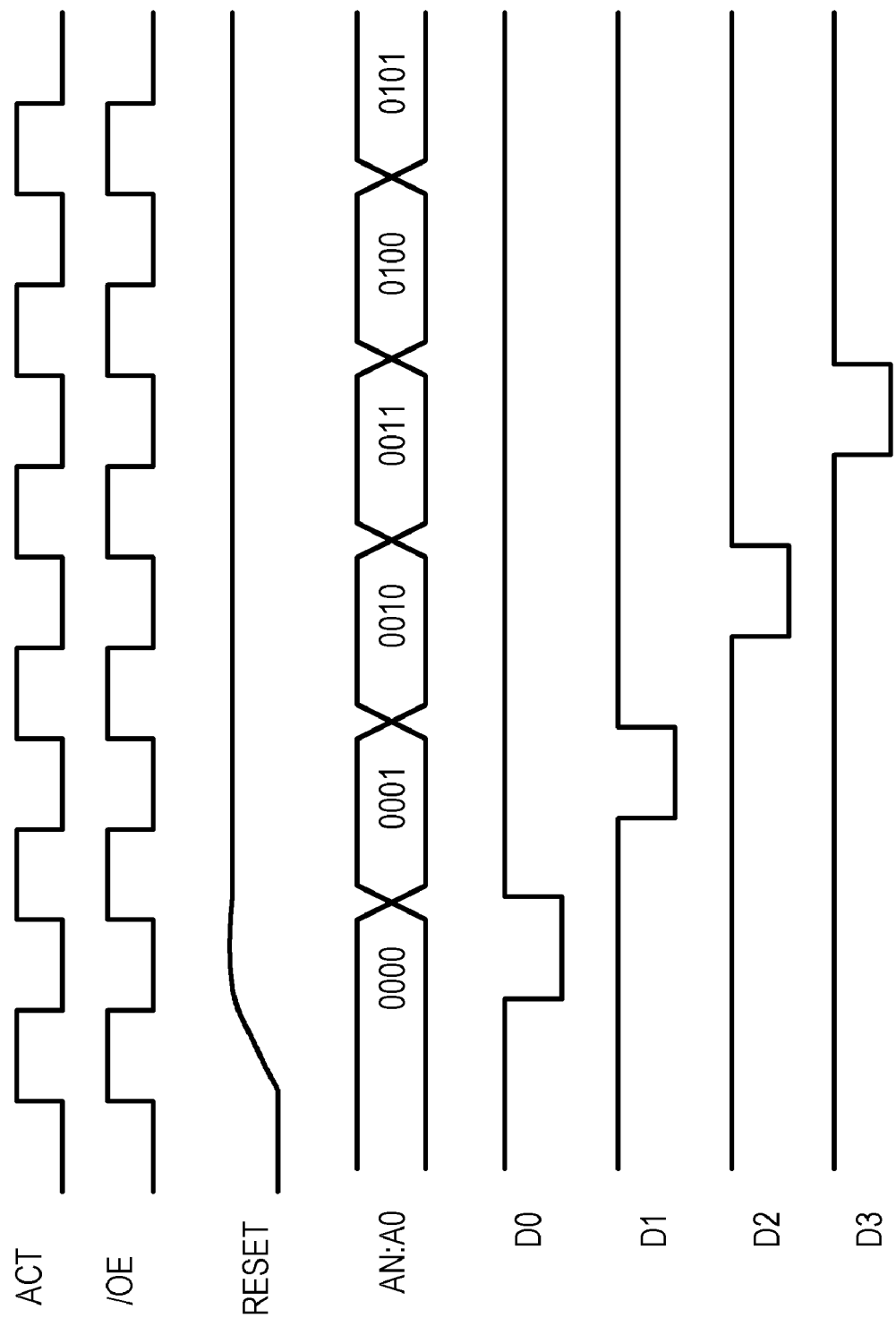
FIG. 2 is a timing diagram of the address generator and address decoder of FIG. 1.

FIG. 2 is a timing diagram of the address generator and address decoder of FIG. 1. The activity signal ACT is pulsed by USB flash controller 10 when the flash memory is being accessed. As the device is powered up, the reset signal goes high as the capacitor for RS is charged by the resistor. After reset ends, each rising edge of activity ACT increments the count of AN:A1. The address lines sequence through states 000, 001, 010, 011, 100, etc. when address generator 12 is a binary up-counter.

Address decoder 14 activates one of the active-low data outputs in response to decoding of the address lines AN:A1 and the Output Enable (/OE) being low. Initially D1 is active low and the other data lines are high (off), so that LED 20 is on while ACT or OE is low. Then when OE is low, for address 001, data output D2 goes low, turning on LED 21, while the other data outputs are high, turning off the other LED's. On the next falling edge of ACT, D3 is low and LED 22 is on, and then D4 is low and the fourth LED turns on. Thus a marquee pattern of illuminating the LED's is produced wherein one LED is lit at a time, and the lit LED appears to travel down the line of LED's.

Figure 3:
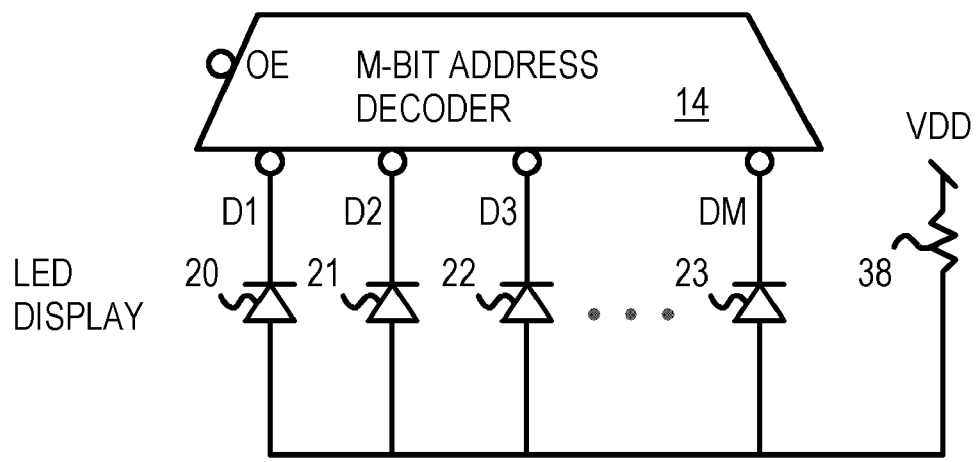
FIG. 3 shows an alternative connection of LED's that share a limiting resistor.

FIG. 3 shows an alternative connection of LED's that share a limiting resistor. LED's 20, 21, 22, . . . 23 are driven by data outputs D1, D2, . . . DM from address decoder 14. However, the anodes of LED's 20, 21, 22, . . . 23 are connected together and share limiting resistor 38. When only one LED is on at a time, sharing a single resistor is not problematic, although if different numbers of LED's were lit at different times, sharing resistor 38 could result in varying light intensities, depending on the number of lit LED's.

Figure 4:
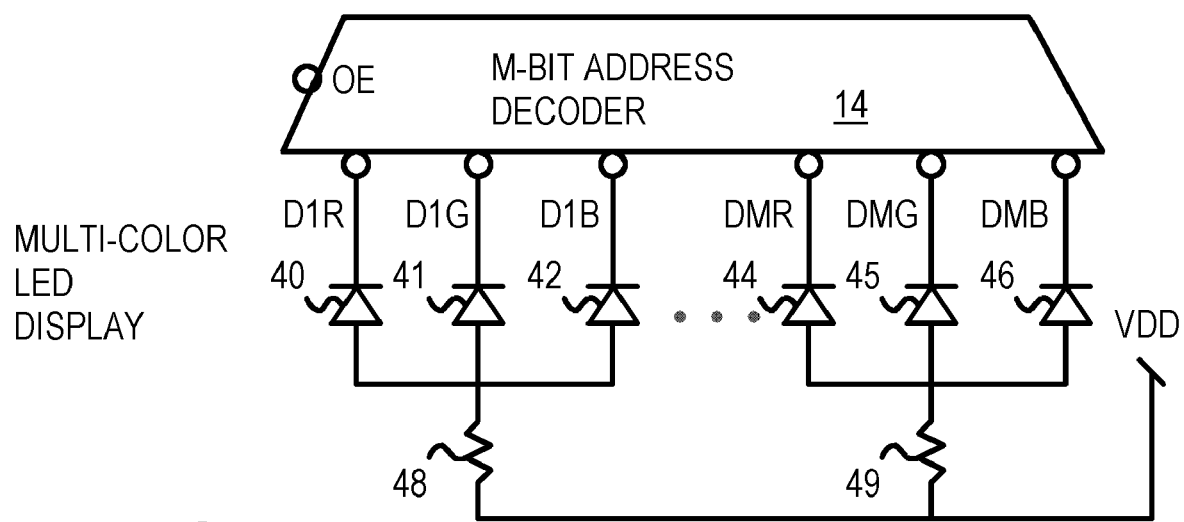
FIG. 4 shows multi-color LED's driven by the address decoder.

FIG. 4 shows multi-color LED's driven by the address decoder. Some LED packages contain multiple components packaged together as a single device. For example, a red, a green, and a blue LED can be packaged together in a 4-pin device and share a common resistor. Address decoder 14 can drive separate data outputs for each color LED. For example, data output D1R drives red LED 40, while data output D1G drives green LED 41, and data output D1B drives blue LED 42. While the cathodes of LED's 40, 41, 42 are separate, the anodes of LED's 40, 41, 42 are connected together and to resistor 48, which connects externally to VDD. Another tri-color LED is shown as LED's 44, 45, 46 and resistor 49. Address decoder 14 drives LED's 44, 45, 46 and any other multi-color LED's.

Figure 5:
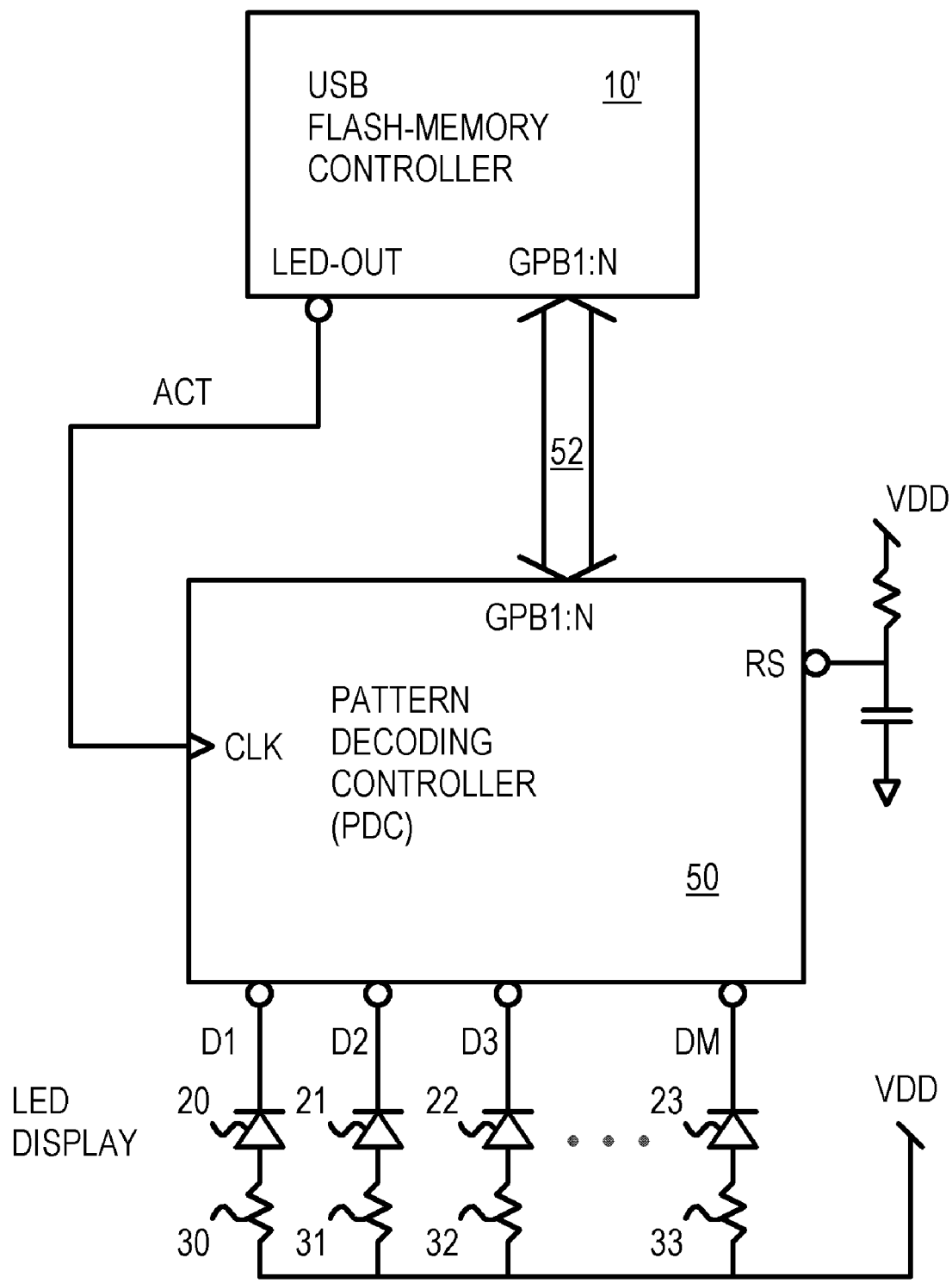
FIG. 5 shows a more integrated pattern-decoding generator for a multi-LED display.

FIG. 5 shows a more integrated pattern-decoding generator for a multi-LED display. Pattern-decoding generator 50 substitutes for functions of the address generator and address decoder in FIG. 1. USB flash controller 10' drives activity line ACT to a clock input of pattern-decoding generator 50 to sequence the pattern on data outputs D1, D2, D3 . . . DM, driving LED's 20, 21, 22, . . . 23. Current to VDD is limited by resistors 30, 31, 32, . . . 33.

An optional bus, general-purpose bus 52, may be included between USB flash controller 10' and pattern-decoding generator 50. More complex and programmable pattern sequences can be supported with general-purpose bus 52. For example, new patterns for cycling LED's 20, 21, 22, . . . 23 can be sent over general-purpose bus 52 to pattern-decoding generator 50. These patterns may be installed from a host PC over the USB bus to USB flash controller 10' and then sent over general-purpose bus 52. Commands as well as new patterns may be transferred over general-purpose bus 52. Commands could select which of several patterns stored in pattern-decoding generator 50 to use.

Different values of resistors 30, 31, 32, 33, 48, and 49 from 5K Ohm to near 0 Ohm can be used for different output voltages. This can be used to adjust the brightness or intensity of the LED's. The normal voltage could be VDD, the middle voltage VDD/2, and the low voltage VDD/4, or some other fractions of VDD or fixed voltages. The power-supply voltage VDD could be from 0.85 volt to 5.0 volts, or some other value.

An oscillator or local clock (not shown) can be driven to pattern-decoding generator 50 for sequencing internal state machines, or an internal clock or un-clocked logic may be used. Pattern-decoding generator 50 may be implemented with combinatorial logic to generate the desired patterns for data outputs D1:DM. A read-only memory (ROM) containing the patterns could also be used, or a field-programmable gate array (FPGA).

FIG. 6 is a table of commands or an address map sent over the general-purpose bus to select LED cycling patterns. The command sent over bits GPB(N:1) on general-purpose bus 52 could be sent as part of a sequence that has a start command word and a checksum, or could be sent alone. When bits GPB(N:1) are 0000 0000, a line-continue cycling pattern as shown in FIG. 9A is selected at the normal output voltage for data outputs D1:M. When bits GPB(N:1) are 0000 0001, the continue-backwards sequence of FIG. 9B is activated.

Other reserved values could light a single LED at the normal output voltage for data outputs D1:M. Other values of GPB(N:1) could select a hold pattern for data outputs D1:M. The hold pattern could be the last state of the cycling pattern, or could be a set pattern with more than one LED lit.

A sequence of commands could be sent over general-purpose bus 52. For example, a command to start the cycling pattern could be sent, then a command to hold the pattern, then the cycling pattern is re-started, but at a lower output voltage to dim the LED's.

New cycling patterns could also be sent over general-purpose bus 52. A sequence-start command word could be sent over general-purpose bus 52 first, followed by several words of the pattern, then ending with a unique sequence-end command word. More complex multi-word command sequences could also be devised.

Figure 7:
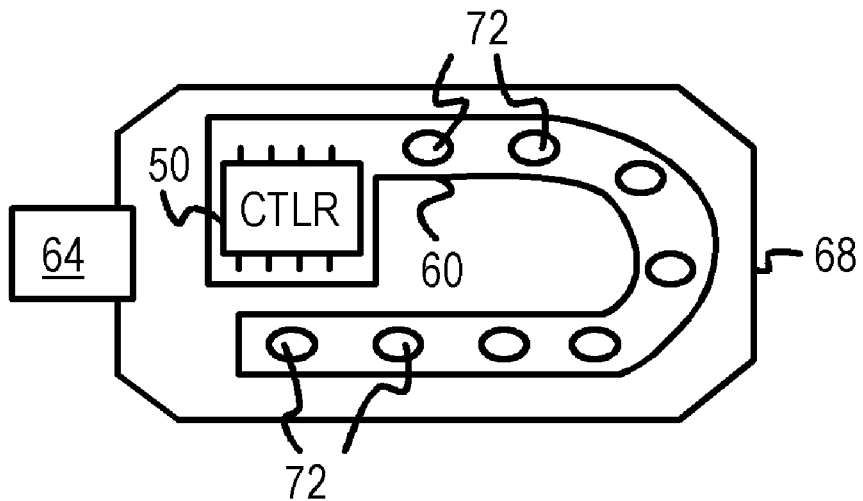
FIG. 7 shows a USB flash drive with a flexible PCB having a multi-LED display.

FIG. 7 shows a USB flash drive with a flexible PCB having a multi-LED display. USB flash drive 68 is a small portable device that contains a USB flash controller and flash memory chips mounted on a small PCB. USB connector 64 can be mounted on this PCB and can be plugged into a matching USB connector on the host.

When the PCB is sufficiently large, pattern-decoding generator 50 may also be mounted on it. Some PCB's may even allow room for more multiple LED's. However, in this embodiment, pattern-decoding generator 50 and LED's 72 are mounted on a separate, flexible PCB 60. Flexible PCB 60 may be attached to the main PCB of USB flash drive 68 by soldering to contact pads of pattern-decoding generator 50. Pattern-decoding generator 50 has pins for soldering on it.

Flexible PCB 60 can be bent in a U-shape to surround the main PCB or other components, or to fit in a casing or molding for USB flash drive 68. LED's 72 may fit in openings or holes in the casing or align with casing windows to allow LED's 72 to be visible to the user. The number of LED's 72 on flexible PCB 60 can vary, but could be 8 single-color or 8 multi-colored LED's in one embodiment.

Figure 8:
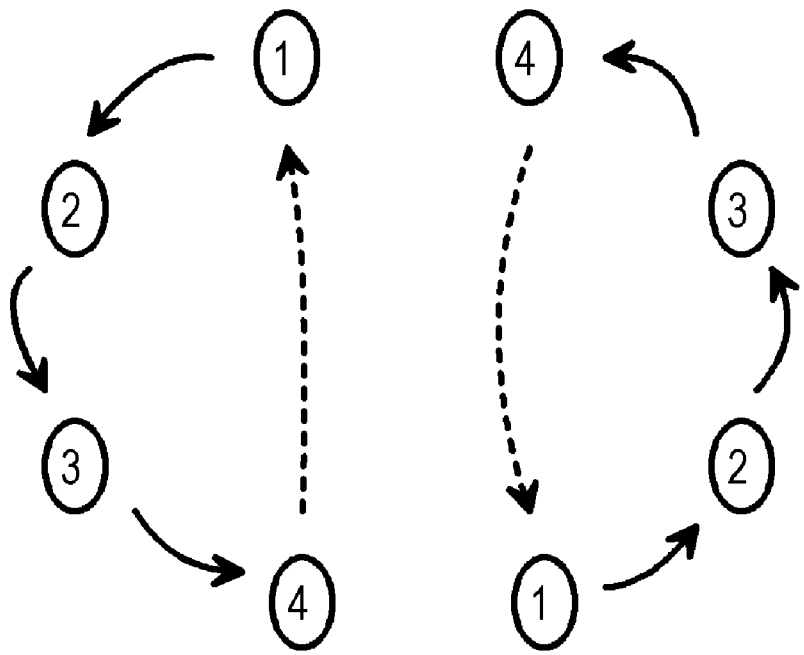
FIG. 8 shows a round-circle multi-LED display.

FIG. 8 shows a round-circle multi-LED display. The LED's driven by the data outputs of pattern-decoding generator 50 (FIG. 5) may be placed in a circular pattern. In this example, 8 LED's are arranged in a circle. The LED's marked "1" are lit first, with the others dark, then LED's marked "2" are lit and the other 6 LED's dark. LED's marked "3" and "4" are then lit in the sequence. The lit LED appears to spin around half of the circle, from LED 1 to LED 2, 3, 4.

Two LED's are lit at a time, one for each half-circle. The lit LED's appear to be spinning around the circle opposite each other. Both LED's 1 may be driven by the same data output of the pattern-decoding generator. Likewise, both of LED's 2 may be driven by D2, both of LED's 3 driven by D3, and both of LED's 4 driven by D4. This can reduce cost since one data output drives two LED's, reducing the number of data outputs from 8 to 4.

When multi-color LED's are substituted, the circle pattern could change color periodically, or after each complete loop of the sequence.

FIGS. 9A–F show linear-display pattern sequences. Each LED is lit in the sequence indicated. LED 1 is lit first, then LED 2, then LED 3, etc., until LED 8 is lit. Then the sequence repeats. Only one LED is lit at a time.

In FIG. 9A, a continue-forward sequence pattern is shown. One LED is lit and the lit LED appears to travel down the line of 8 LED's from left to right. A simple marquee pattern is produced. The display sequence is much more attention-grabbing than a single LED or just a few LED's.

In FIG. 9B, a continue-backward sequence pattern is shown. One LED is lit and the lit LED appears to travel down the line of 8 LED's from right to left. This is a backward-traveling marquee pattern is produced.

FIG. 9C shows a jump-1 forward pattern. One LED is skipped or jumped over as the lit LED travels from left to right. The pattern continues with the second-most LED from the left at time 5. Thus this marquee pattern moves more rapidly from left to right, and repeats itself using the skipped LED's. FIG. 9D shows the same jump-1 pattern in reverse.

FIG. 9E shows a jump-2 forward pattern. Two LED's are jumped over each time the lit LED is changed. For example, the left-most LED is lit first, then the next two LED positions (LED's 4, 7) are skipped over and the fourth LED position, LED 2, is lit. Then LED's 5, 8 are skipped and LED 3 is lit. The pattern returns to LED's 4, 5, 6 on the second pass, and LED's 7, 8 on the third pass from left to right. FIG. 9F shows the jump-2 backward pattern.

FIGS. 10A–F show dual linear-display pattern sequences. Each data output form the pattern-decoding generator drives two LED's. For example D1 drives the two LED's 1, then D2 drives the two LED's 2, etc. Two LED's are lit at once.

FIG. 10A shows dual continue-forward patterns. Two LED's are lit at once and appear to travel across four LED positions from left to right. This produces a dazzling pattern at moderate speeds. FIG. 10B shows the dual continue-backward pattern.

The two lit LED's can appear to travel inward towards the middle, as shown in FIG. 10C, or outward from the middle, as shown in FIG. 10D. FIGS. 10E, F show dual jump patterns that skip over LED positions and then repeat, lighting the skipped-over LED's in the second pass. These can also produce very visually stimulating pattern sequences.

FIGS. 11A–D show dual circular pattern sequences. Each data output from the pattern-decoding generator drives two LED's. For example D1 drives the two LED's 1, then D2 drives the two LED's 2, etc. Two LED's are lit at once.

Some LED's are lit more often than others in these sequences. In FIG. 11A, the lit LED moves forward from the left-most LED 1, to LED 2, 3, 4. Then the lit LED moves backwards an re-lights LED 3, re-lights LED 2, and then repeats with LED 1. Thus LED's 2/6 and 3/5 are lit twice in each sequence, but LED's 1, 4 are lit only once per sequence. The loop sequences can both move clockwise, as shown in FIG. 11A, or counter-clockwise, as shown in FIG. 11B. One loop of four LED's can move clockwise while the other loop of four LED's moves counter-clockwise, as shown in FIG. 11C with inward loops and FIG. 11D with outward loops.

Alternate Embodiments

Several other embodiments are contemplated by the inventors. Rather than use USB buses, other serial buses may be used such as PCI Express, ExpressCard, Firewire (IEEE 1394), serial ATA, serial attached small-computer system interface (SCSI), etc.

The pattern-decoding generator and other controllers and functions can be implemented in a variety of ways. Functions can be programmed and executed by a CPU or other processor, or can be implemented in dedicated hardware, firmware, or in some combination. Many partitioning of the functions can be substituted.

Various colors for the LED's could be used. Besides red, green, and blue, other colors displayed may include amber, brown, violet, gray, and white. Some colors can be produces by combinations or mixing of the 3 primary colors. The voltage to the LED's can be adjusted to adjust the color intensity.

Rather than standard LED's, other display technologies could be substituted, such as lit pipes, strips of LED's, liquid crystal display (LCD) elements, thin-film transistors, Micro-Electro-Mechanical Switches (MEMS), electronic ink, etc.

The activity signal could be a periodic signal activated when flash-memory activity occurs. The period and duty cycle of the activity signal could vary. For example, the activity signal could be a square wave signal at 12.5 Hz, with 40 milli-second high and low pulses, or could have other values. The length of time for reset being active after power-up can be adjusted by adjusting the time constant of the resistor and capacitor on the RS pin.

The number of bits for GPB(N:1) could be a different value of N than for the address lines of address decoder 14. For example, bits GPB(N:1) could be 8 bits while address decoder 14 has 16 address lines.

The LED's could be arranged linearly in a line. The line could be bent into various shapes, such as the U-shape of flexible PCB 60 of FIG. 7. The same linear patterns can be used even when the line of LED's is thus bent. The LED's can be arranged in other shapes, such as the circle of FIG. 8, or in a triangle, square, polygon, or other shapes.

Display patterns could be combined in a variety of ways. For example, the continue-forward pattern of FIG. 9A could be immediately followed by the continue-backward pattern of FIG. 9B. When multi-color LED's are substituted, the pattern or sequence of patterns could change color periodically, or after each complete loop of the sequence. Patterns could be selected and changed randomly to add visual variety. All LED's can be kept dark for a holding period after each sequence, such as for half or a tenth of a second before the pattern repeats. All LED's could also be briefly lit at the end of a sequence or to indicate an error or completion of an operation. More complex displays with multiple segments could be used, such as starbursts, asterisks, etc.

The multi-LED display and the pattern-decoding generator could be used in a variety of other applications. The display could be used in a notebook or desktop PC, a personal digital assistant (PDA), cell phone, or unified device. Other uses could include a memory module, external or internal flash drives of various shapes and sizes, music players such as MP3 devices, video players such as MPEG-4 devices, card readers, badges, smart cards, keyboards, mice or other pointing devices, speakers, or headsets. Flash-memory cards or other portable device cards using these form factors can also benefit from the multi-LED display, such as secure-digital, compact-flash, multi-media cards, smart media cards, ExpressCards, and memory sticks. The multi-LED display could also be used for a variety of decorations or with other electronic devices such as a LED flashlight or a LED light tube. A 2-way write-protect switch could be used, or more complex switches such as a 3-way on-off-write-protect switch could be used to turn off the LED display.

The flexible PCB could be single-layer of a polyimide cover layer laminated to copper metal, or could have multiple layers.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. sect. 1.72(b). Any advantages and benefits described may not apply to all embodiments of the invention. When the word "means" is recited in a claim element, Applicant intends for the claim element to fall under 35 USC sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A portable memory device comprising:
   a memory;
   a device controller that receives commands from a host over a serial bus and controls access to the memory for the host;
   wherein the device controller generates an activity signal when the memory is being accessed;
   a pattern-decoding generator that receives the activity signal from the device controller, the pattern-decoding generator generating a sequence of data signals on a plurality of data lines, the sequence being activated in response to the activity signal; and
   a display having a plurality of light-emitting diodes (LED's) that are driven by the plurality of data lines from the pattern-decoding generator to produce a visually changing sequence of illuminated LED's;
   wherein the visually changing sequence of illuminated LED's comprises at least four visually different states,
   whereby the visually changing sequence on the display is generated when the memory is being accessed.

2. The portable memory device of claim 1 wherein the serial bus is a Universal-Serial-Bus (USB), a PCI Express bus, an ExpressCard bus, a Firewire IEEE 1394 bus, a serial ATA bus, or a serial attached small-computer system interface bus.

3. The portable memory device of claim 1 wherein the visually changing sequence on the display comprises a circular sequence on a round-circle multi-LED display, a linear-display pattern sequence on a linear display, a dual linear-display pattern sequence, or a dual circular pattern sequence.

4. A portable device with a visually-dazzling display comprising:
   memory means for storing user data for a user of a host;
   device controller means, coupled to the memory means and for coupling to the host, for generating an activity signal when the memory means is accessed;
   pattern generating means, coupled to receive the activity signal from the device controller means, for driving a sequence onto a plurality of display-data lines; and
   multi-light display means, having a plurality of display elements that are separately illuminated in response to the plurality of display-data lines;
   wherein the multi-light display means has at least four display elements;
   wherein the sequence driven onto the plurality of data lines produces a visually changing sequence of illuminated display elements that comprises at least four visually different states in the sequence.

5. The portable device with a visually-dazzling display of claim 4 wherein each data line connects to at least two of the display elements including a first display element in a first display section and a second display element in a second display section;
   wherein the multi-light display means is a dual display with the sequence being displayed on both the first display section and on the second display section.

6. The portable device with a visually-dazzling display of claim 4 further comprising:
   flexible printed-circuit board means for supporting the display elements in the multi-light display means and for supporting the pattern generating means;
   wiring means, on the flexible printed-circuit board means, for connecting the plurality of data lines from the pattern generating means to the display elements.

* * * * *